United States Patent
Nakagawara et al.

[11] Patent Number: 6,060,381
[45] Date of Patent: May 9, 2000

[54] METHOD OF MANUFACTURING AN ELECTRONIC PART HAVING AN AIR-BRIDGE INTERCONNECTION

[75] Inventors: Osamu Nakagawara, Yasu-gun; Masato Kobayashi, Ohmihachiman; Yukio Yoshino, Ohtsu, all of Japan

[73] Assignee: Murata Manufacturing Co., Ltd., Japan

[21] Appl. No.: 08/851,805

[22] Filed: May 6, 1997

Related U.S. Application Data

[62] Division of application No. 08/449,121, May 24, 1995, abandoned.

[30] Foreign Application Priority Data

May 25, 1994 [JP] Japan ................................. 6-111376

[51] Int. Cl.⁷ ..................................... H01L 21/445
[52] U.S. Cl. .......................................... 438/619; 438/671
[58] Field of Search ........................ 438/666, 669, 438/619, 670, 671

[56] References Cited

U.S. PATENT DOCUMENTS 4,308,090 12/1981 Te Velde et al. .
5,148,260 9/1992 Inoue et al. .
5,171,713 12/1992 Matthews ........................... 437/189
5,219,713 6/1993 Robinson .
5,408,742 4/1995 Zaidel et al. .

FOREIGN PATENT DOCUMENTS

| 0309805 | 4/1989 | European Pat. Off. . |
| 0501407 | 9/1992 | European Pat. Off. . |
| 4-2151 | 1/1992 | Japan ........................ H01L 21/90 |
| 4290212 | 10/1992 | Japan . |
| 6-89940 | 3/1994 | Japan . |

OTHER PUBLICATIONS

IBM Tech. Discl. Bull. vol. 32 No. 8A (Jan. 1990) pp. 88–89.

*Primary Examiner*—Caridad Everhart

[57] ABSTRACT

An electronic part having an air-bridge interconnection has a flat air-bridge interconnection body, no interconnection loss, high Q and low power consumption. Also disclosed is a method of manufacturing such electronic parts. The flat air-bridge interconnection body is obtained by conducting two-stage selective plating including selective plating for forming posts on post base electrodes and selective plating for forming the air-bridge interconnection body.

14 Claims, 4 Drawing Sheets

METHOD OF MANUFACTURING AN ELECTRONIC PART HAVING AN AIR-BRIDGE INTERCONNECTION

This is a division of application Ser. No. 08/449,121 filed on May 24, 1995, abandoned.

BACKGROUND OF THE INVENTION

1. Field of the Invention

The present invention relates to an electronic part having a flat air-bridge interconnection and a method of manufacturing such an electronic part.

2. Description of Related Art

A conventional electronic part having an air-bridge interconnection has a structure in which an air-bridge interconnection body 14b has recessed shoulder portions 14c formed by the manufacturing method thereof at upper portions of posts 14a, as shown in FIG. 11.

The method of manufacturing such electronic parts having a conventional air-bridge interconnection will be described below with reference to FIGS. 7 to 11.

First as shown in FIG. 7, post base electrodes 12a and 12b and a lower interconnection 12c between the post base electrodes 12a and 12b are formed on a substrate 11. Next, a lower resist 13 is formed on the substrate 11 in such a manner that openings 13a are formed on the post base electrodes 12a and 12b and such that the lower interconnection 12c is covered with the lower resist 13.

Thereafter, a power supplying film 15 (which may for example be used to supply power in an electrolytic plating process for forming the metal film 14a, 14b discussed below in connection with FIG. 10) is formed on the lower resist 13 and on the post base electrodes 12a and 12b in the openings 13a, as shown in FIG. 8.

As shown in FIG. 9, an upper resist 16 is next formed in such a manner that an opening 16a corresponding to a predetermined length of a bridge interconnection body is formed on the power supplying film 15.

Subsequently, a metal film is formed so as to provide posts 14a and an air-bridge interconnection body 14b at the same time, as shown in FIG. 10. Thereafter, the upper resist 16, the portion of the power supplying film 15 formed on the lower resist 13, and the lower resist 13 are removed, whereby an electronic part having an air-bridge interconnection, shown in FIG. 11, is completed.

However, since the conventional electronic part having an air-bridge interconnection, shown in FIG. 11, is manufactured by providing at the same time the metal film constituting the posts 14a of the air-bridge interconnection and the metal film constituting the body 14b of the air-bridge interconnection, the shoulder portions 14c are formed in the air-bridge interconnection body 14b above the posts 14a. The shoulder portions 14c cause variations in the thickness of the interconnection and thereby cause conductor loss and deterioration in Q.

SUMMARY OF THE INVENTION

In view of the aforementioned problems, an object of the present invention is to provide an electronic part having an air-bridge interconnection in which an air-bridge interconnection body is flat, has low wiring loss, has a high Q value and consumes less power.

To achieve the above-described object, in one aspect of the present invention, there is provided an electronic part having an air-bridge interconnection in which a portion of an air-bridge interconnection body formed on a post on a post base electrode is flat.

In another aspect of the present invention, there is provided a method of manufacturing an electronic part having an air-bridge interconnection which comprises the steps of:

1) forming, on a substrate, post base electrodes for an air-bridge interconnection;
2) forming, on said substrate, a lower resist having post openings on said post base electrodes;
3) providing a metal film in said post openings on said post base electrodes in such a manner that said metal film is level with said lower resist;
4) forming a power supplying film on both said metal film and said lower resist;
5) forming, on said power supplying film, an upper resist having a body opening corresponding to a length of an air-bridge interconnection body;
6) forming a metal film constituting said air-bridge interconnection body in said body opening by electrolytic plating; and
7) removing said upper resist, said power supplying film for plating and said lower resist.

The power supplying film may be formed by either electron beam deposition or sputtering.

In still another aspect of the present invention, there is provided a method of manufacturing an electronic part having an air-bridge interconnection which comprises the steps of:

1) forming, on a substrate, post base electrodes for an air-bridge interconnection;
2) forming, on said substrate, a lower resist having post openings on said post base electrodes;
3) providing a metal film in said post openings on said post base electrodes in such a manner that said metal film is level with said lower resist;
4) forming, on said lower resist, an upper resist having a body opening corresponding to a length of an air-bridge interconnection body on both said metal film and said lower resist;
5) forming a metal film constituting said air-bridge interconnection body in said body opening by electroless plating; and
6) removing said upper resist and said lower resist.

The electronic part having an air-bridge interconnection according to the present invention is characterized in that an air-bridge interconnection body is flat. Thus, there is no air-bridge interconnection loss, Q is high, and power consumption is reduced.

Further, since the method of manufacturing electronic parts having an air-bridge interconnection according to the present invention is characterized by two-stage selective plating which includes selective plating conducted to form the posts of the air-bridge interconnection at the same level as the surface of the surrounding lower resist, and selective plating conducted to form the metal film of the air-bridge interconnection body, the air-bridge interconnection body can be formed flat.

The foregoing and other objects, features and advantages of the invention will be better understood from the following detailed description of preferred embodiments of the invention, with reference to the drawings.

DETAILED DESCRIPTION OF PREFERRED EMBODIMENTS

A first embodiment of the manufacturing method according to the present invention will be described with reference to FIGS. 1 through 5.

Figure 1:
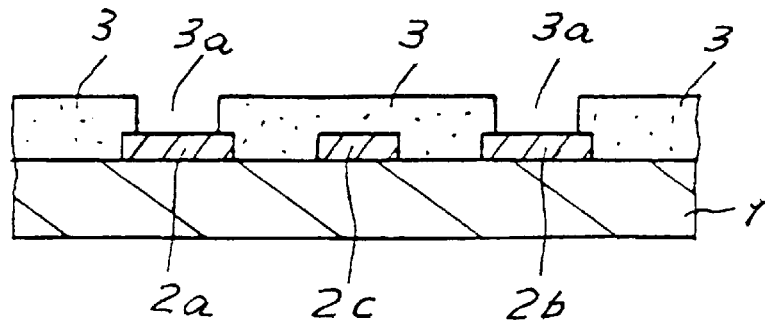
FIG. 1 illustrates a step in the manufacturing process according to a first embodiment of the present invention in which post base electrodes, a lower interconnection and a lower resist are formed on a substrate.

As shown in FIG. 1, a 5 $\mu$m-thick Au layer is formed on a ceramic substrate 1 to form post base electrodes 2a and 2b for an air-bridge interconnection and a lower interconnection 2c which is intended to be air-bridged between the post base electrodes 2a and 2b. Next, a lower resist 3 is formed on the substrate 1 in such a manner that openings 3a are formed on the post base electrodes 2a and 2b and that the lower interconnection 2c is covered with the lower resist 3.

Figure 2:
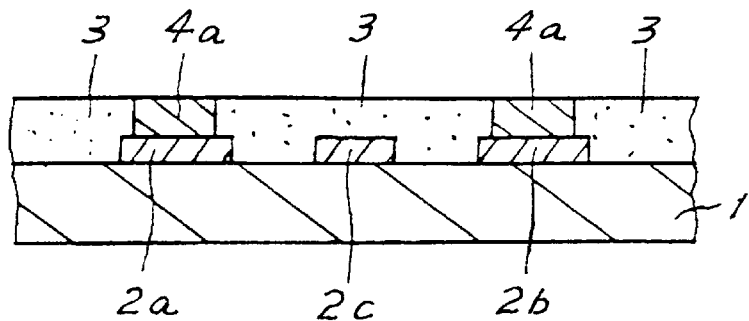
FIG. 2 illustrates a step in which posts of an air-bridge interconnection are formed.

Thereafter, an Au layer is formed in the openings 3a on the post base electrodes 2a and 2b by electrolytic plating in such a manner that it fills the openings 3a up to the level of the lower resist 3 to form posts 4a of an air-bridge interconnection, as shown in FIG. 2. In that step, the electrolytic plating is conducted for 30 minutes, the current value is 3 mA/cm$^2$ and the temperature of the plating solution is 65° C.

Figure 3:
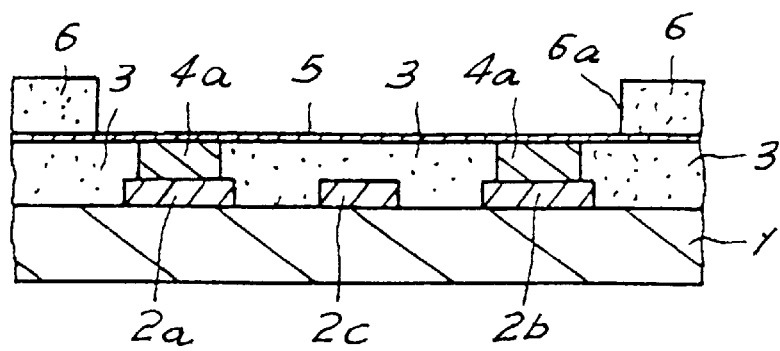
FIG. 3 illustrates a step in which a power supplying film and an upper resist are formed.

Subsequently, a 50 nm-thick Au layer is formed on both the lower resist 3 and the posts 4a as a power supplying film 5 by electron beam deposition, as shown in FIG. 3. Electron beam deposition is conducted in a planetary system at a deposition rate of 3 nm/sec. The substrate is not heated, because of the poor heat resistance of the resist. Next, an upper resist 6, having an opening 6a corresponding to a predetermined length of the bridge interconnection body, is formed to a thickness of 7 $\mu$m on the power supplying film 5 by the photolithographic process.

Figure 4:
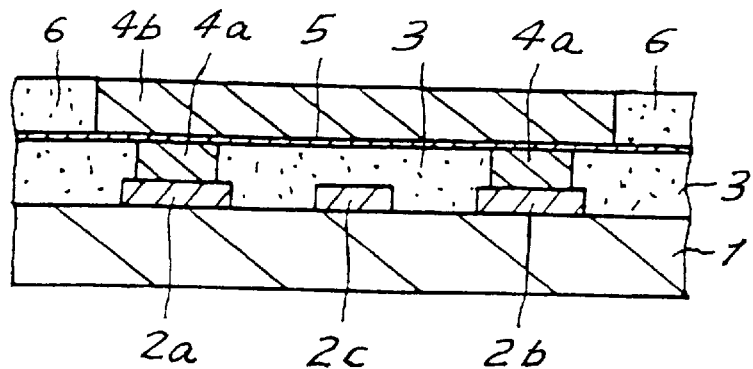
FIG. 4 illustrates a step in which an air-bridge interconnection body is formed.
Figure 5:
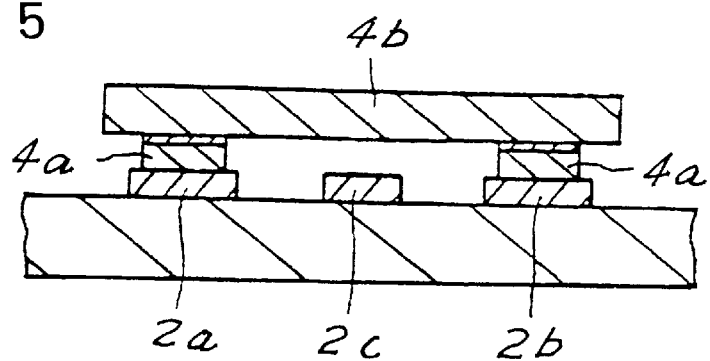
FIG. 5 illustrates a step in which the lower resist, the power supplying film and the upper resist are removed.

Next, as shown in FIG. 4, a 5 $\mu$m-thick Au layer is formed in the opening 6a as an air-bridge interconnection body 4b by electrolytic plating. This electrolytic plating is performed under the same conditions as the electrolytic plating performed to form the posts 4a shown in FIG. 2. Thereafter, the upper resist 6, the portion of the power supplying film 5 formed on the lower resist 3, and the lower resist 3 are removed, whereby an air-bridge interconnection, shown in FIG. 5, is completed.

Figure 6:
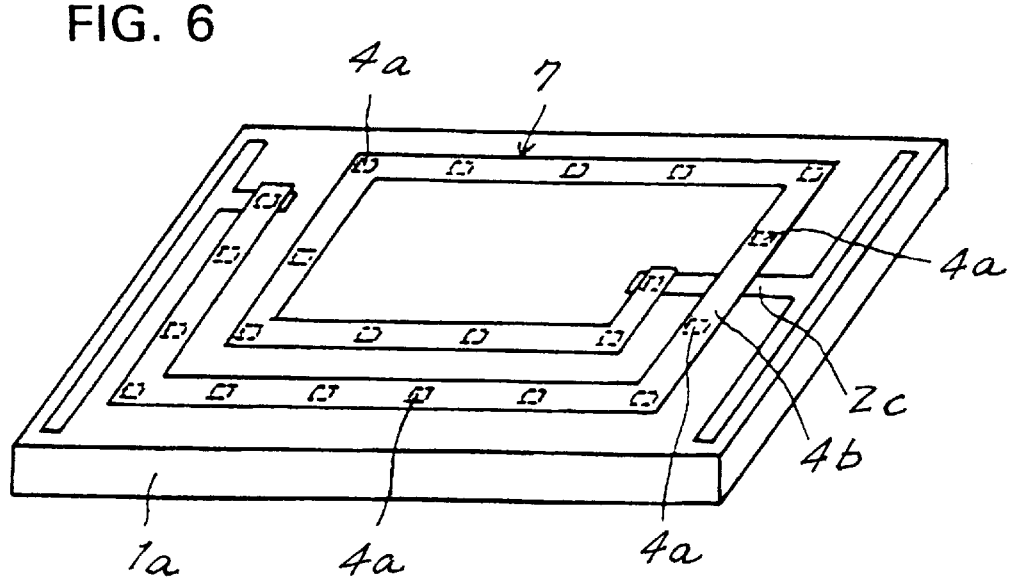
FIG. 6 is a perspective view of a spiral inductor manufactured by the manufacturing method according to the present invention.
Figure 7:
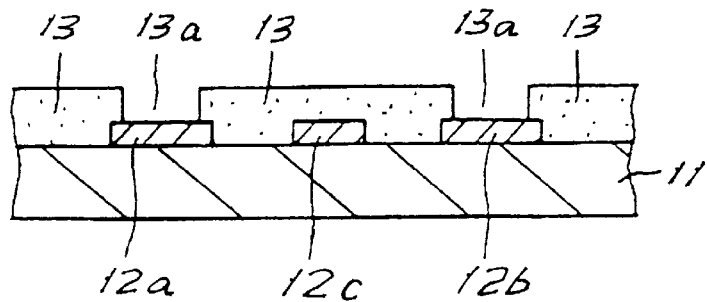
FIG. 7 illustrates a step in a conventional manufacturing process in which post base electrodes, a lower interconnection and a lower resist are formed on a substrate.
Figure 8:
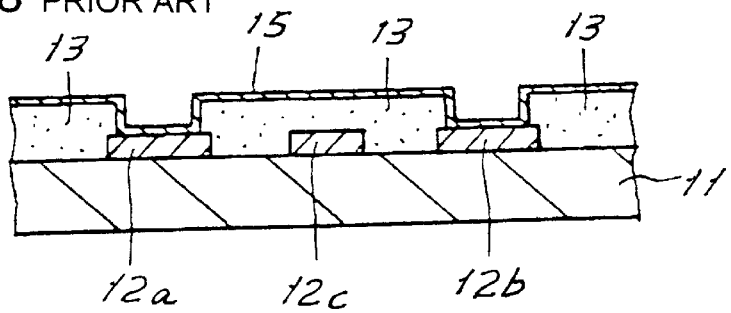
FIG. 8 illustrates a step in which a power supplying film is formed.
Figure 9:
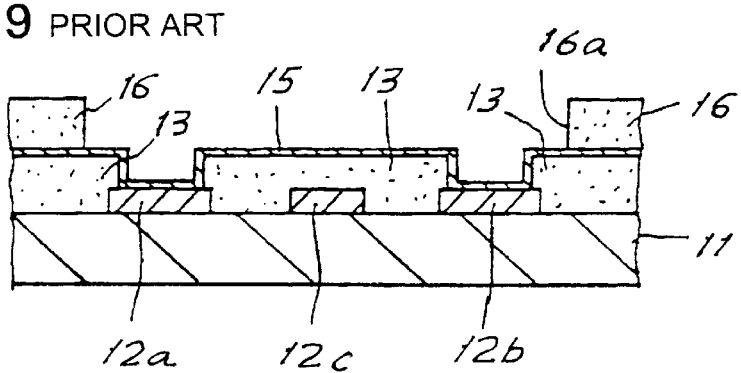
FIG. 9 illustrates a step in which an upper resist is formed.
Figure 10:
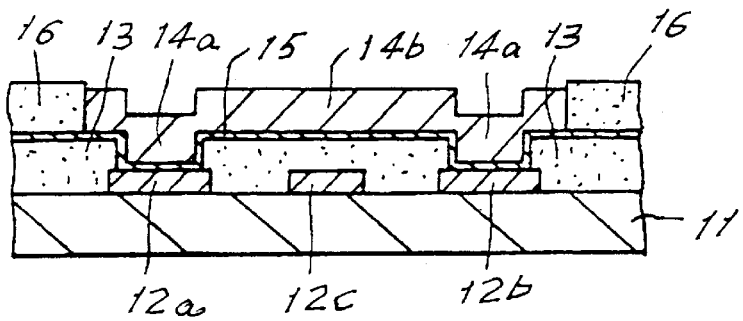
FIG. 10 illustrates a step in which posts and a body of an air-bridge interconnection are formed at the same time.
Figure 11:
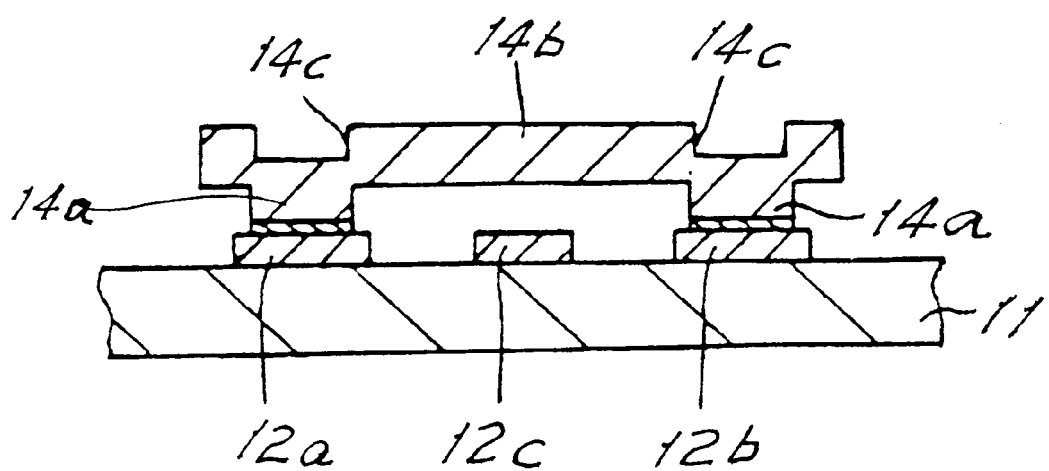
FIG. 11 illustrates a step in which the upper resist, the power supplying film and the lower resist are removed.

The present inventors manufactured a spiral inductor 7 having about one and half turns, shown in FIG. 6, by using the manufacturing method according to the first embodiment of the present invention. The size of a GaAs substrate 1a was 1.6×3.2×0.6 mm. The width and thickness of the metallized layer were 100 $\mu$m and 5 $\mu$m, respectively. The height of the post was 5 $\mu$m, and the inductance was 10 nH.

For comparison, the present inventors manufactured a spiral inductor, corresponding to that shown in FIG. 6, by a conventional manufacturing method, and measured the Q value of both the product according to the present invention and the conventional example at a frequency of 500 MHz. The results of the measurements are shown in Table 1. In the spiral inductor 7 shown in FIG. 6, the lower interconnection 2c intersects the air-bridge interconnection body 4b at a single point, and the entire air-bridge interconnection body 4b (the upper interconnection) floats above the substrate 1a on the plurality of posts 4a. In this embodiment, since there is no variation in the thickness of the interconnection, generated by the recesses of the shoulders, above the posts 4a, as compared with the conventional interconnection, conductor loss is reduced and Q is improved.

TABLE 1

|  | Q value |
|---|---|
| The product according to the present invention | 30 |
| Conventional product | 22 |

It is clear from the above table that the Q value of the product according to the present invention is about 36% higher than that of the conventional product.

A second embodiment of the manufacturing method according to the present invention will be described below.

In the second embodiment, the posts 4a and the air-bridge interconnection body 4b are formed in the processes shown in FIGS. 2 and 4, respectively, not by electrolytic plating as employed in the first embodiment but by electroless copper plating. Electroless copper plating is performed using an electroless copper plating solution shown in Table 2 under the conditions shown in Table 2.

TABLE 2

| Composition | Copper sulfate | 9 g/liter |
|---|---|---|
|  | EDTA | 30 g/liter |
|  | Formalin | 4 g/liter |
|  | Sodium hydroxide | 4 g/liter |
|  | pH | 12 |
|  | Stabilizer | little |
|  | Surface active agent | little |
| Operating | Temperature | 70° C. |
| Conditions | Deposition speed | 2 $\mu$m/hr |

Because of the use of electroless copper plating, the fourth manufacturing step of the first embodiment in which the power supplying film is formed is not necessary. Other processes are the same as those of the first embodiment.

A third embodiment of the manufacturing method according to the present invention will be described below.

In the third embodiment, the power supplying film 5 described in connection with FIG. 3 is formed not by electron beam deposition as employed in the first embodiment but by sputtering. Sputtering is conducted under the following conditions. Other processes are the same as those of the first embodiment.

TABLE 3

| Apparatus used | RF magnetron sputter |
|---|---|
| Target | Au |
| Power | 50 W |
| Film forming rate | 0.2 nm/sec |
| Film thickness | 50 nm |

As will be understood from the foregoing description, the electronic part having an air-bridge interconnection according to the present invention is characterized in that an air-bridge interconnection body formed on the posts of an air-bridge interconnection is flat. Thus, there is no air-bridge interconnection loss, Q is high, and power consumption is reduced.

Further, the method of manufacturing electronic parts having an air-bridge interconnection according to the present invention is characterized by two-stage selective plating which includes selective plating conducted to form the posts of the air-bridge interconnection at the same level as the surface of the surrounding lower resist, and selective plating conducted to form the metal film of the air-bridge interconnection body. Thus, the flat air-bridge interconnection body can be formed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing an electronic part having an air-bridge interconnection, said method comprising the steps of:

forming, on a substrate, post base electrodes for an air-bridge interconnection;

forming, on said substrate, a lower resist having post openings on said post base electrodes;

providing a metal film in said post Openings on said post base electrodes in such a manner that said metal film is level with said lower resist;

forming a power supplying film on both said metal film and said lower resist;

forming, on said power supplying film, an upper resist having a body opening corresponding to a length of an air-bridge interconnection body to be formed;

forming a metal film constituting said air-bridge interconnection body in said body opening by electrolytic plating utilizing said power supplying film; and removing said lower resist, said power supplying film and said upper resist.

2. The method of manufacturing an electronic part having an air-bridge interconnection according to claim 1, wherein said power supplying film is formed by electron beam deposition.

3. The method of manufacturing an electronic part having an air-bridge interconnection according to claim 1, wherein said power supplying film is formed by sputtering.

4. The method of manufacturing an electronic part having an air-bridge interconnection according to claim 1, wherein said air-bridge interconnection body is formed with a substantially constant cross-sectional area between said post openings.

5. A method of manufacturing an electronic part having an air-bridge interconnection, said method comprising the steps of:

forming, on a substrate, post base electrodes for an air-bridge interconnection;

forming, on said substrate, a lower resist having post openings on said post base electrodes;

providing a metal film in said post openings on said post base electrodes in such a manner that said metal film is level with said lower resist;

forming, on said lower resist, an upper resist having a body opening corresponding to a length of an air-bridge interconnection body on both said metal film and said lower resist;

forming a metal film constituting said air-bridge interconnection body in said body opening by electroless plating; and removing said lower resist and said upper resist.

6. The method of manufacturing an electronic part having an air-bridge interconnection according to claim 5, wherein said air-bridge interconnection body is formed with a substantially constant cross-sectional area between said post openings.

7. The method of manufacturing an electronic part having an air-bridge interconnection according to claim 1, wherein said step of forming said upper resist is performed after said step of forming said power supplying film.

8. The method of manufacturing an electronic part having an air-bridge interconnection according to claim 4, wherein said step of forming said upper resist is performed after said step of forming said power supplying film.

9. The method of manufacturing an electronic part having an air-bridge interconnection according to claim 1, wherein said step of forming said upper resist is performed after said step of forming said metal film in said post openings.

10. The method of manufacturing an electronic part having an air-bridge interconnection according to claim 4, wherein said step of forming said upper resist is performed after said step of forming said metal film in said post openings.

11. The method of manufacturing an electronic part having an air-bridge interconnection according to claim 5, wherein said step of forming said upper resist is performed after said step of forming said metal film in said post openings.

12. The method of manufacturing an electronic part having an air-bridge interconnection according to claim 6, wherein said step of forming said upper resist is performed after said step of forming said metal film in said post openings.

13. The method of manufacturing an electronic part having an air-bridge interconnection according to claim 4, wherein said air-bridge connection body is formed with substantially flat upper and lower major surfaces.

14. The method of manufacturing an electronic part having an air-bridge interconnection according to claim 6, wherein said air-bridge connection body is formed with substantially flat upper and lower major surfaces.

* * * * *